United States Patent [19]
Schweighofer

[11] Patent Number: 6,118,337
[45] Date of Patent: Sep. 12, 2000

[54] METHOD FOR THE GENERATION OF CONTROL SIGNALS FOR A POWER AMPLIFIER AND POWER AMPLIFIER

[75] Inventor: Peter Schweighofer, Nuremberg, Germany

[73] Assignee: Siemens Aktiengesellschaft, Munich, Germany

[21] Appl. No.: 09/324,445

[22] Filed: Jun. 2, 1999

[30] Foreign Application Priority Data

Jun. 3, 1998 [DE] Germany .......................... 198 24 767

[51] Int. Cl.$^7$ ...................................................... H03F 3/38
[52] U.S. Cl. ......................... 330/10; 363/60; 330/207 A; 330/251
[58] Field of Search ........................... 363/59, 60; 330/2, 330/10, 207 A, 251

[56] References Cited

U.S. PATENT DOCUMENTS

| | | | |
|---|---|---|---|
| 4,403,197 | 9/1983 | Swanson | 330/10 |
| 5,546,299 | 8/1996 | Lenz | 363/71 |
| 5,999,040 | 12/1999 | Do et al. | 363/60 |

FOREIGN PATENT DOCUMENTS

| | | |
|---|---|---|
| 40 17 207 | 5/1991 | Germany . |
| WO 95/10881 | 4/1954 | WIPO . |

OTHER PUBLICATIONS

–Dissertation entitled "Der Schwigkreiswechselrichter mit Gegenspannunglast zur Versorgung von Verbrauchern mit gepulstem Gleichstromm," Kühnel (1986) pp. 128–135.

Primary Examiner—Michael B Shingleton
Attorney, Agent, or Firm—Hill & Simpson

[57] ABSTRACT

In a flexible and uncomplicated method for generating control signals for a power amplifier, and in a power amplifier having at least two output stages connected in series at the output side, which are driven dependent on a setting value, the setting value is classified into one of several setting value classes, a respective operating mode for each output stage is determined at least dependent on the setting value class and on a time slice value and at least one control signal for each output stage is generated dependent on the operating mode and, if warranted, on the setting value.

12 Claims, 2 Drawing Sheets

METHOD FOR THE GENERATION OF CONTROL SIGNALS FOR A POWER AMPLIFIER AND POWER AMPLIFIER

BACKGROUND OF THE INVENTION

1. Field of the Invention

The present invention is directed to a power amplifier of the type having two output stages connected in series at the output side of the power amplifier, driven by a setting valve, and method for the generation of control signals for such a power amplifier. The inventive power amplifier and method can be used for all power amplifier applications, but are particularly suited for use in a medical apparatus, particularly a magnetic resonance tomography apparatus. In this context, the inventive power amplifier can be utilized as a gradient amplifier in order to supply a gradient coil with current.

2. Description of the Prior Art

Magnetic field gradients are generated by gradient coils during the operation of a magnetic resonance tomography apparatus or a magnetic resonance system. Each gradient coil has current flowing therein that, in an exactly defined shape of the current curve, can reach values up to, for example, 300 A or more. The shape of the current curve often exhibits steep edges. In order to achieve the high rates of current change that are required, it can be necessary to apply a voltage of, for example, 2000 V or more to the gradient coil. Such power demands can be met only with great outlay, if at all, with a single output stage.

U.S. Pat. No. 5,546,299 discloses a power amplifier having at least two controllable voltage sources connected in series at its output side, in a power supply for a gradient amplifier. A number of control units are fashioned as modulators for generating pulse-width drive signals for the voltage sources. In an alternative embodiment described in German 43 04 517, a number of voltage sources are driven with switching signals offset in time for the peak load mode.

German OS 40 17 207 discloses means for feeding a dipole load wherein a number of DC voltage step-down regulators are driven according to the principle of pulse-width modulation. The uniformly large clock cycles are respectively offset by 1/n of the period duration.

The dissertation "Der Schwingkreiswechselrichter mit Gegenspannungslast zur Versorgung von Verbrauchern mit gepulstem Gleichstrom" by Werner Kühnel, Technical Faculty of the University of Erlangen, 1986, pages 133–134, discloses a multi-DC-AC converter for high-power x-ray generators. An offset drive of the individual DC-AC converters is optionally provided.

United States Application having Atty. Docket No. P99, 0811 ("Power Amplifier and Method for the Drive of a Power Amplifier," Schweighofer) filed simultaneously herewith and assigned to the same assignee (Siemens AG) as the present application, discloses driving a number of output stages, connected in parallel at the output side, with offset switching clocks in a gradient amplifier in order to reduce the ripple of the output voltage.

Insofar as details of the output stage drive are disclosed at all in the above publicly available documents, complicated modulation circuits are utilized. Moreover, these circuits are often not optimally designed, for example, in view of the system dynamics or the effective switching frequency or of the output stage load of the power amplifier.

SUMMARY OF THE INVENTION

In a power amplifier having a number of output stages connected in series, it is an object of the present invention to provide a flexible and uncomplicated method and circuit for generating control signals for the output stages.

The above object is achieved in accordance with the principles of the present invention in a power amplifier, and in a method for generating control signals for a power amplifier, wherein at least two output stages connected in series at the output side of the power amplifier are driven dependent on a setting value, and wherein the setting value is classified into one or more setting value classes, a respective operating mode is determined for each output stage dependent on the setting value class and on a time slice value which is provided by a continuously varying time slice clock, and wherein at least one control signal is generated for each output stage dependent on the operating mode and on the setting value.

The basis of the invention is to first classify an adjustment value that determines the overall modulation of the power amplifier and, then to define an operating mode for each output stage dependent on the class of the adjustment value which has been identified. A time slice value is thereby utilized, this changing in a time slice clock. The invention thus enables a very flexible control of the individual output stages according to different points of view. For example, the load can be uniformly distributed among the output stages and/or a maximum system dynamic behavior of the power amplifier can be achieved and/or the effective switching frequency of the output voltage of the power amplifier can be increased. Moreover, if the individual output stages have properties which differ from output stages-to-output stage, these can be taken into consideration.

Modulation and time data are inventively utilized in the determination of the output stage operating modes. Since data are combined in classes of adjustment values, or time slices, the processing outlay required is relatively slight. The invention therefore can be realized with a simple circuit or a short program loop that is rapidly executed. Special components or fast processors are not required despite the high demands made on the power amplifier.

The inventive method is preferably implemented by a digital circuit or a digital calculating method or a combination thereof. The outlay is then especially low and the method can be easily modified and adapted.

In preferred embodiment of the invention, the allocation of the operating modes to the output stages is continuously permutated. As a result, a uniform output stage load and/or a high effective switching frequency of the output voltage can be achieved. The permutation is preferably cyclical. In an especially simple embodiment, each permutation step is a shift. The permutation is preferably such that the voltage pulses generated by the output stages are offset relative to one another.

A modulating mode and/or a pass mode and/or a full modulation mode are preferably provided as possible operating modes of the output stages. Not all output stages need to be configured for all of these operating modes. Preferably, exactly one output stage is always in the modulating mode. The drive of this output stage can ensue dependent on a correction value that indicates the error produced by the classification of the adjustment value.

In further preferred embodiments of the invention, each output stage operates according to a pulse-width modulation method. An especially high system dynamic behavior can be achieved when the time slice clock exhibits the same frequency as the pulse-width modulation switching clock of at least one of the output stages.

The class of adjustment value preferably determines how many output stages are switched in each of the possible operating modes. As used herein, an output stage is considered an "active" output stage when it is in the modulating mode or the full modulation mode.

DESCRIPTION OF THE PREFERRED EMBODIMENTS

Figure 1:
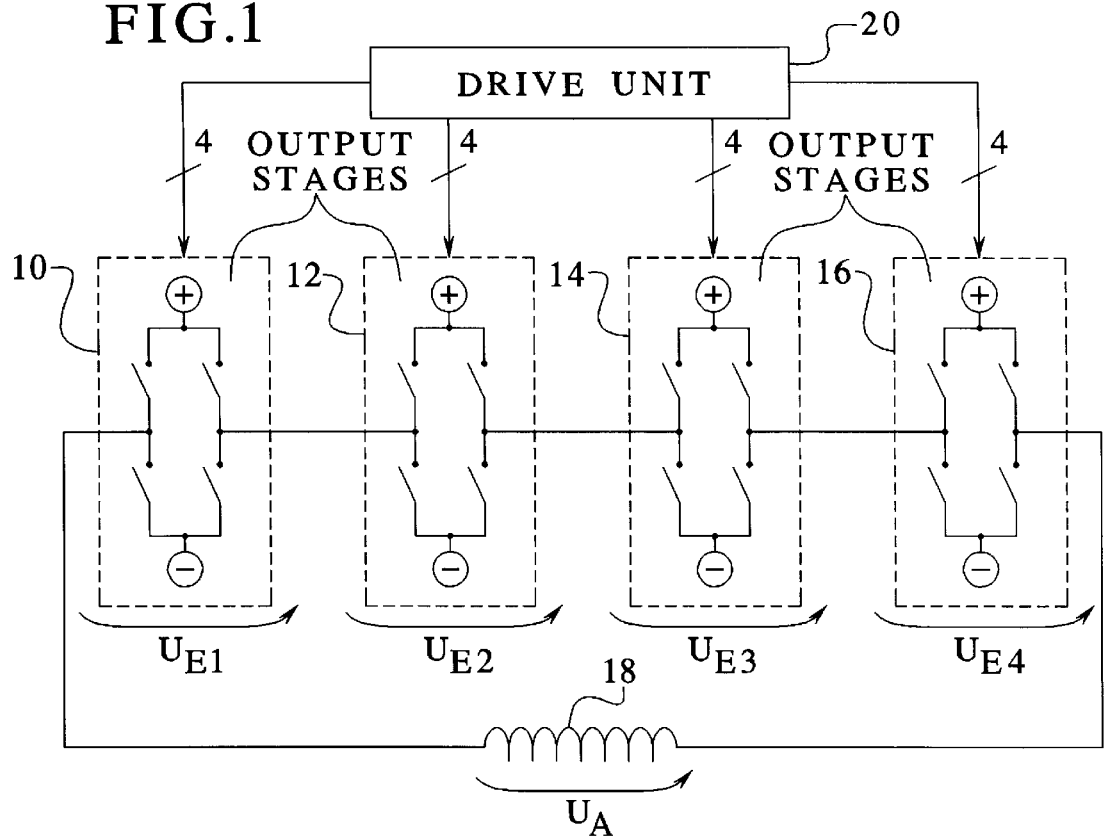
FIG. 1 is a block circuit diagram of a power amplifier connected to a load, constructed and operating in accordance with the invention.

The power amplifier shown in FIG. 1 is fashioned as gradient amplifier of a magnetic resonance tomograph apparatus. In the exemplary embodiment described herein, the power amplifier has four output stages 10, 12, 14, 16 that are connected in series at the output side and connected to a load 18, fashioned as a gradient coil. The output stages 10, 12, 14, 16 generate output stage voltages $U_{E1}$, $U_{E2}$, $U_{E3}$, $U_{E4}$, the output voltage $U_A$ of the power amplifier across the load 18 being formed as their sum. In alternative embodiments, more or fewer output stages are provided which, moreover, can exhibit respectively different properties from each other.

The output stages are constructed in a known way, for example as disclosed in German OS 43 04 517. Each of the output stages 10, 12, 14, 16 contains a power bridge circuit that is formed by four switch elements (for example, IGBTs) schematically shown in FIG. 1. Two of these switch elements in each bridge are connected in series in order to form a bridge arm between two poles of a supply voltage. The respective output stage voltages $U_{E1}$, $U_{E2}$, $U_{E3}$, $U_{E4}$ are taken at the shunt arms of the bridges.

A drive unit 20 generates control signals for all of the switch elements of the output stages 10, 12, 14, 16. The drive unit 20 can be constructed either as a unitary assembly, or as a number of modules allocated one-to-one to the output stages 10, 12, 14, 16.

Figure 2:
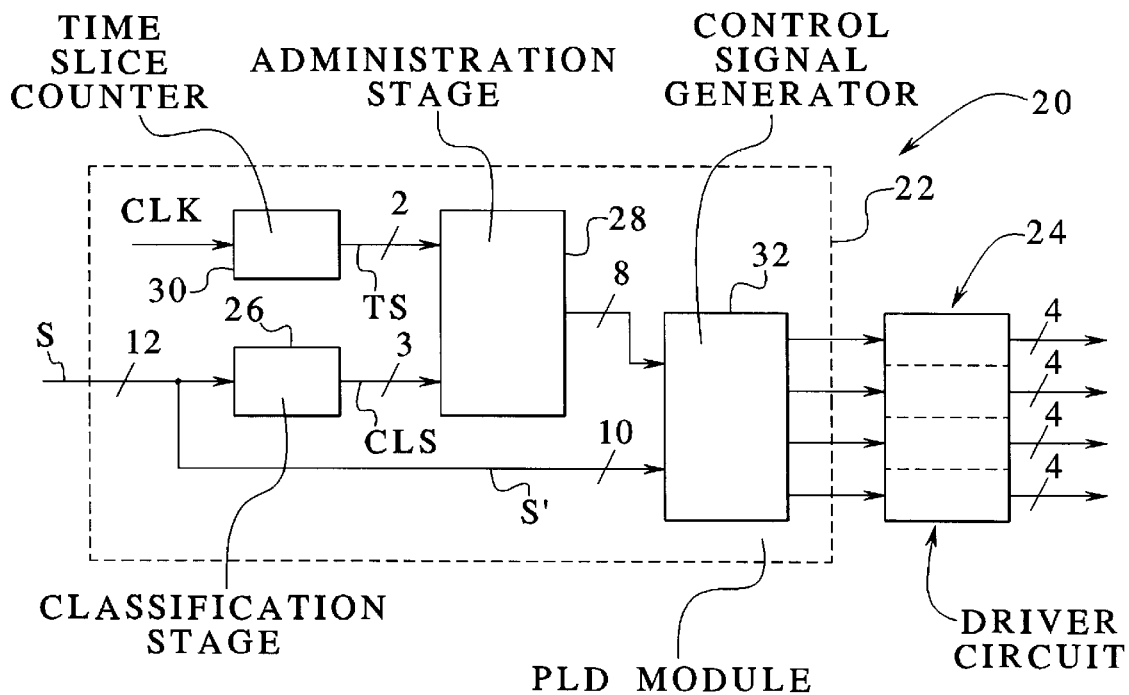
FIG. 2 is a block circuit diagram of a drive circuit for the power amplifier of FIG. 1, constructed and operating in accordance with the invention.

FIG. 2 shows the structure of the drive unit 20, that has a PLD component 22 (programmable logic device) and a driver circuit 24 in the exemplary embodiment described herein. In alternative embodiments, the functions of the PLD component 22 described below can be implemented by a suitably programmed universal processor or by a digital signal processor. Mixed hardware and software implementations are also possible.

The PLD component 22 receives an adjustment value S as an input value, in the form of a binary value that is 12 bits wide and which has an operational sign. The adjustment value S can, for example, be produced by a known digital regulator of the magnetic resonance tomography apparatus and can indicate the polarity and amplitude of the output voltage $U_A$ of the power amplifier. The absolute value of the adjustment value in this case corresponds to the pulse-duty factor (on time) of an imaginary power amplifier that operates according to the pulse-width modulation method and exhibits only a single output stage.

At the output side, the PLD component 22 is connected to the driver circuit 24 that in turn offers a total of sixteen control signals, respectively for the four switch elements of the individual output stages 10, 12, 14, 16. In the exemplary embodiment described herein, the PLD component 22 generates sixteen binary signals corresponding to the control signals, and the driver circuit 24 serves only for signal shaping and amplification. In alternative embodiments, the driver circuit 24 can assume further functions. The signals supplied by the PLD component 22 can then be suitably encoded, so that fewer connections are required from the PLD component 22 to the driver circuit 24.

Before the internal structure of the PLD module 22 is discussed, the basic principle of the method implemented by the drive unit 20 shall be explained. In this drive method, the output voltage $U_A$ is produced by one or more output stages 10, 12, 14, 16. To that end, the setting value S is first classified in order to determine how many of the output stages 10, 12, 14, 16 must be utilized in order to achieve the required output voltage $U_A$. A decision is then made in a second step as to how the individual output stages 10, 12, 14, 16 should be driven. This allocation is periodically modified.

In the exemplary embodiment described herein, the time slices during which the output stage allocation remains constant are only as long as the switching frequency cycles of the pulse-width modulation in the output stages 10, 12, 14, 16. Each output stage 10, 12, 14, 16 thus generates a maximum of only one voltage pulse during each time slice. Given a typical switching frequency of 100 kHz, the time slice duration thus amounts to 10 μs. The drive unit 20 must therefore be powerful enough in order to implement the aforementioned steps during this time duration. In alternative embodiments, the time slice duration can deviate from the duration of a switching clock cycle and, in particular, can amount to a multiple thereof.

In order to implement the drive method that was just described, the PLD module 22 has a classification stage 26, an administration stage 28, a time slice counter 30 and a control signal generator 32.

The classification stage 26 serves for classifying the setting value S. The classification indicates the number of output stages 10, 12, 14, 16 to be switched into an active operating mode. This classification ensues dependent on voltage ranges of the output voltage $U_A$. Given the exemplary embodiment with four output stages 10, 12, 14, 16 and an operationally signed, binarily encoded setting value S described herein, the classification is very simple since the voltage range is derived on the basis of the two most significant bits of the setting value S (after the operational sign bit). This can be seen in greater detail from the following Table 1. The first bit of the setting value S indicates the operational sign; the two bits following thereupon indicate the voltage range:

TABLE 1

Allocation of the Setting Value S to voltage ranges.

| Setting Value S (Decimal) | Setting Value S (Binary) | Range |
|---|---|---|
| 2047 ... 1536 | 0111 1111 1111 ... 0100 0000 0000 | "11" |
| 1535 ... 1024 | 0101 1111 1111 ... 0100 0000 0000 | "10" |
| 1023 ... 512 | 0011 1111 1111 ... 0010 0000 0000 | "01" |
| 511 ... 0 and | 0001 1111 1111 ... 0000 0000 0000 and | "00" |
| 0 ... -511 | 0000 0000 0000 ... 1011 1111 1111 | |
| -512 ... -1023 | 1010 0000 0000 ... 1011 1111 1111 | "01" |
| -1024 ... -1535 | 1100 0000 0000 ... 1101 1111 1111 | "10" |
| -1536 ... -2047 | 1110 0000 0000 ... 1111 1111 1111 | "11" |

The overall classification data contain the operational sign bit and the two bits of the setting value S indicating the voltage range. The classification stage 26 in the exemplary embodiment described herein thus only has to forward the "first" three bits of the setting value S to the administration stage 28 as setting value class CLS. In alternative embodiments, the classification of the setting value S can be more complex. This is true particularly if the setting value represents some other numerical representation or if the number of output stages is not a power of two or if the output stages exhibit different properties (for example, different maximum voltages or different switching frequencies). In these cases, a truth table (look-up table) or a suitable algorithm can serve for classification.

In addition to containing the three bit-wide setting value class CLS, the administration stage 28 contains a cyclically running time slice value TS that is generated by a time slice counter 30. The time slice counter 30 is a two bit-wide binary counter clocked with a time slice clock CLK. The time slice value TS is employed for the allocation of the operating modes determined dependent on the setting value class CLS to the individual output stages 10, 12, 14, 16. As already mentioned, the time slice clock CLK in the exemplary embodiment described herein is equal to the pulse-width modulation switching clock of the output stages 10, 12, 14, 16, so that the output stage functions can be permutated in every switching clock step.

In the exemplary embodiment, the administration stage 28 is implemented as a memory field that contains a look-up table. The setting value class CLS (that in turn contains information about the operational sign and the voltage range), as well as the time slice value TS, serve as input values. As outputs, the administration stage 28 determines an operating mode for each of the four output stages 10, 12, 14, 16, this being encoded as a binary word that is two bits wide. The following can be provided as operating modes, as an example:

a) Operating Mode O (Binary encoding 00): The output stage is in a pass mode during the entire time slice. No output stage voltage is generated and the outputs of the output stage are connected low-impedance (via two switch elements).

b) Operating Mode M (Binary encoding 01): The output stage is in a modulating mode. An output stage voltage pulse is generated whose duration is dependent on that part of the setting value S not expressed by the setting value class and whose polarity is determined according to the operational sign of the setting value S.

c) Operating Mode+(Binary encoding 10): The output stage is in a positive fully modulated mode wherein it supplies a positive output stage voltage of maximum amplitude during the entire time slice.

d) Operating Mode–(Binary encoding 11): The output stage is in a negative fully modulated mode wherein it supplies a negative output stage voltage of maximum amplitude during the entire time slice.

The pulse pattern determined dependent on the setting value class CLS is cyclically executed with the frequency of the time slice clocks CLK. Overall, the administration stage 28 undertakes the allocation of the operating modes to the output stages 10, 12, 14, 16 as shown in the following Table 2:

TABLE 2

Look-Up Table of the Administration Stage 28

| Operational Sign | Range | TS | First Output stage | Second Output Stage | Third Output Stage | Fourth Output Stage |
|---|---|---|---|---|---|---|
| 0 | "00" | 00 | 01 (M) | 00 (0) | 00 (0) | 00 (0) |
| 0 | "00" | 01 | 00 (0) | 01 (M) | 00 (0) | 00 (0) |
| 0 | "00" | 10 | 00 (0) | 00 (0) | 01 (M) | 00 (0) |
| 0 | "00" | 11 | 00 (0) | 00 (0) | 00 (0) | 01 (M) |
| 0 | "01" | 00 | 01 (M) | 10 (+) | 00 (0) | 00 (0) |
| 0 | "01" | 01 | 00 (0) | 01 (M) | 10 (+) | 00 (0) |
| 0 | "01" | 10 | 00 (0) | 00 (0) | 01 (M) | 10 (+) |
| 0 | "01" | 11 | 10 (+) | 00 (0) | 00 (0) | 01 (M) |
| 0 | "10" | 00 | 01 (M) | 10 (+) | 10 (+) | 00 (0) |
| 0 | "10" | 01 | 00 (0) | 01 (M) | 10 (+) | 10 (+) |
| 0 | "10" | 10 | 10 (+) | 00 (0) | 01 (M) | 10 (+) |
| 0 | "10" | 11 | 10 (+) | 10 (+) | 00 (0) | 01 (M) |
| 0 | "11" | 00 | 01 (M) | 10 (+) | 10 (+) | 10 (+) |
| 0 | "11" | 01 | 10 (+) | 01 (M) | 10 (+) | 10 (+) |
| 0 | "11" | 10 | 10 (+) | 10 (+) | 01 (M) | 10 (+) |
| 0 | "11" | 11 | 10 (+) | 10 (+) | 10 (+) | 01 (M) |
| 1 | "00" | 00 | 01 (M) | 00 (0) | 00 (0) | 00 (0) |
| 1 | "00" | 01 | 00 (0) | 01 (M) | 00 (0) | 00 (0) |
| 1 | "00" | 10 | 00 (0) | 00 (0) | 01 (M) | 00 (0) |
| 1 | "00" | 11 | 00 (0) | 00 (0) | 00 (0) | 01 (M) |
| 1 | "01" | 00 | 01 (M) | 11 (−) | 00 (0) | 00 (0) |
| 1 | "01" | 01 | 00 (0) | 01 (M) | 11 (−) | 00 (0) |
| 1 | "01" | 10 | 00 (0) | 00 (0) | 01 (M) | 11 (−) |
| 1 | "01" | 11 | 11 (−) | 00 (0) | 00 (0) | 01 (M) |
| 1 | "10" | 00 | 01 (M) | 11 (−) | 11 (−) | 00 (0) |
| 1 | "10" | 01 | 00 (0) | 01 (M) | 11 (−) | 11 (−) |
| 1 | "10" | 10 | 11 (−) | 00 (0) | 01 (M) | 11 (−) |
| 1 | "10" | 11 | 11 (−) | 11 (−) | 00 (0) | 01 (M) |
| 1 | "11" | 00 | 01 (M) | 11 (−) | 11 (−) | 11 (−) |
| 1 | "11" | 01 | 11 (−) | 01 (M) | 11 (−) | 11 (−) |
| 1 | "11" | 10 | 11 (−) | 11 (−) | 01 (M) | 11 (−) |
| 1 | "11" | 11 | 11 (−) | 11 (−) | 11 (−) | 01 (M) |

The output values of the administration stage 28 are supplied to the control signal generator 32. As already described, this generates binary representations of the control signals for the switch elements of the output stages 10, 12, 14, 16 according to a known pulse-width modulation method. A number of different methods can be utilized. Preferably, however, modulation methods as disclosed in detail in German OS 34 38 034 and German OS 40 24 160 are employed.

In order to be able to determine the degree of modulation for an output stage in the operating mode M, the signal generator 32 receives a correction value S' that is ten bits wide and that is composed of the nine less significant bits and the operational sign bit of the setting value S. Given the allocation method shown in Table 2, exactly one single output stage is in the modulating operation in every time slice. The voltage pulse generated by this output stage therefore must supply that part of the output voltage $U_A$ that was left out of consideration in the formation of the setting value class CLS. This part expressed by the correction value S' corresponds to the less significant bits of the setting value S in the exemplary embodiment. If, in alternative embodiments, the setting value class CLS is determined in some other way, the generation of the correction value S' must also be suitably adapted.

Figure 3:
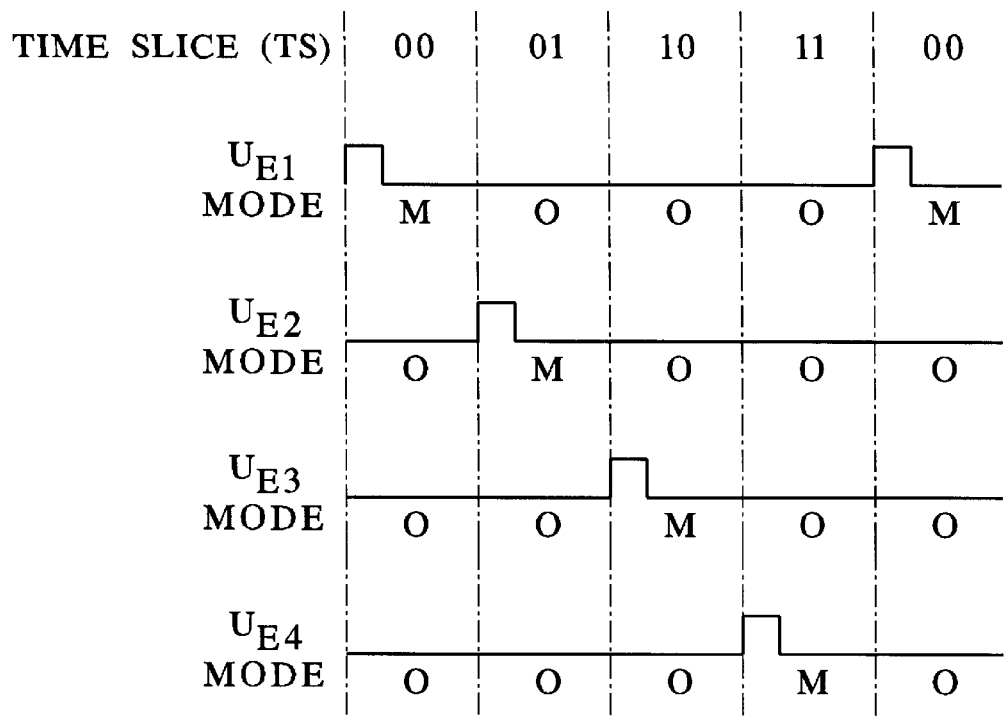
FIG. 3 and FIG. 4 show signal curves during operation of the power amplifier of FIGS. 1 and 2 in two different classes of the adjustment value, respectively.

FIG. 3 shows the output voltages $U_{E1}$, $U_{E2}$, $U_{E3}$, $U_{E4}$ of the output stages 10, 12, 14, 16 in the voltage range (00) and given positive operational sign. It is derived from the voltage range value that a single output stage is to be operated in mode M and the three remaining output stages are to be operated in mode O. The allocation is cyclically permutated in the time slice clock CLK in the fashion of a shift register. As a result, each output stage 10, 12, 14, 16 operates with only a fraction (one-fourth here) of the effective frequency of the output voltage $U_A$. A high system dynamic behavior is nonetheless achieved because the calculation and evaluation of the correction value S' as well as the generation of the corresponding voltage pulse ensue in every time slice.

Figure 4:
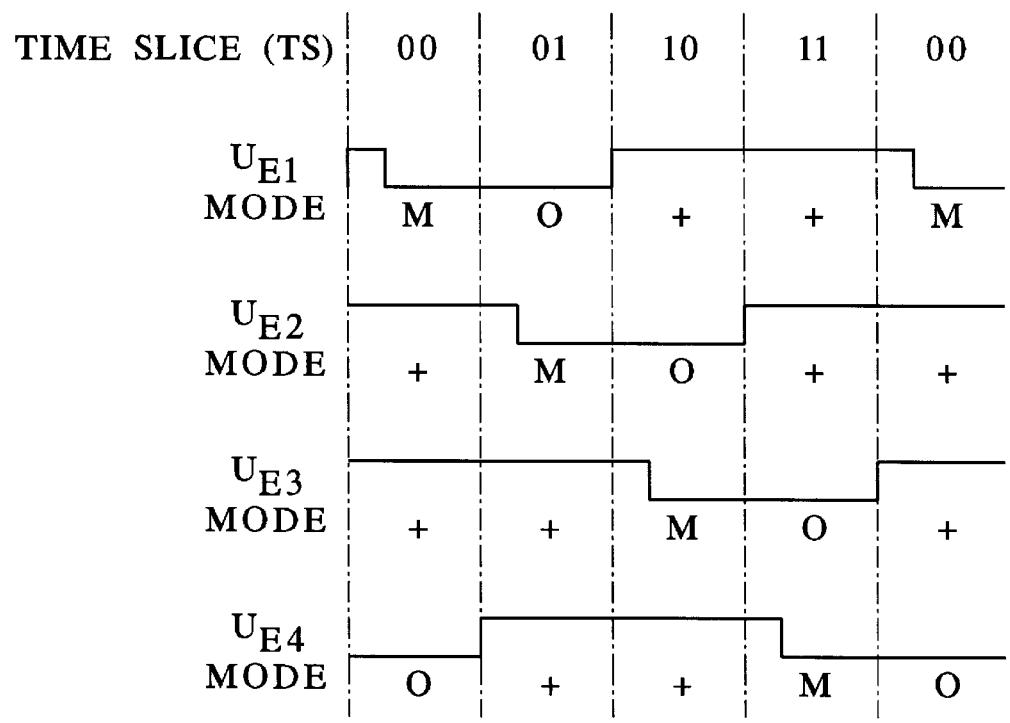

The illustration shown in FIG. 4 corresponds to that of FIG. 3, however, the setting value S has a voltage range "10". Two output stages are in the positive full modulation mode during every time slice, one output stage is in the modulating mode and one output stage is in the pass mode. Here, too, the operating mode allocation is shifted by one step with every time slice change. In alternative embodiments, other permutation cycles are provided. At every output stage 10, 12, 14, 16, the two time slices in the full modulation mode and the one time slice in the modulating mode adjoin one another such that only one output stage voltage pulse is generated in a complete cycle of four time slices, this voltage pulse exhibiting a length of a number of time slices. As a result, the number of switching events (on and off events) in every output stage 10, 12, 14, 16 is kept low in order to reduce the dissipated power. The same effect is achieved in a slightly modified version of the method of Table 2, whereby the signal generator 32 generates the voltage pulse of an output stage in the modulating mode at the end of the respective time slice.

In modified embodiments, arbitrary other properties of the power amplifier can be optimized in addition to or instead of the aforementioned objectives. The look-up table of the administration stage 28 and/or that of the classification stage 26 must merely be modified for that purpose. In order to realize more complex pulse chains, a number of different time slice values TS can be provided, which may require that a wider time slice counter 30 be utilized, as warranted. These properties are particularly advantageous for complex output stage arrangements having different output stages.

Although the present invention has been described with reference to a specific embodiment, those of skill in the art will recognize that changes may be made thereto without departing from the scope and spirit of the invention as set forth in the appended claims.

I claim as my invention:

1. A method for generating control signals for a power amplifier having two output stages connected in series at an output side, comprising the steps of:

providing setting values for respectively operating said output stages;

classifying said setting values into a plurality of setting value classes;

providing cyclically running time slice values from a time slice clock;

determining an operating mode for each of said output stages dependent on the setting value class of the setting value for that output stage and said time slice value; and generating a control signal for each output stage dependent on said operating mode and driving the respective output stages with said control signals.

2. A method as claimed in claim 1 comprising the additional step of representing said setting values in digital form, and wherein the step of classifying said setting values comprises digitally classifying said setting values and wherein the step of determining an operating mode for each output stage comprises digitally determining an operating mode for each output stage.

3. A method as claimed in claim 1 comprising the step of cyclically permutating the allocation of the operating modes to the output stages dependent on said time slice value.

4. A method as claimed in claim 1 comprising providing at least one modulating mode and one pass mode as operating modes available in said plurality of said operating modes for at least one output stage.

5. A method as claimed in claim 4 comprising placing exactly one output stage in said modulating mode during each time slice represented by a time slice value.

6. A method as claimed in claim 4 comprising the additional step of generating a correction value derived from said setting value, and operating at least one of said output stages in said modulating mode dependent on said correction value.

7. A method as claimed in claim 1 comprising providing at least one pass mode and one full modulation mode as operating modes for at least one of said output stages.

8. A method as claimed in claim 1 comprising driving the respective output stages with said control signals using pulse-width modulation.

9. A method as claimed in claim 8 comprising implementing said pulse width modulation with a pulse width modulation switching clock in at least one of said output stages, and operating said time slice clock with a frequency which is equal to a frequency of said pulse width modulation switching clock.

10. A method as claimed in claim 1 wherein each of said output stages generates voltage pulses, and wherein said control signals drive said respective output stages with said voltage pulses being respectively offset relative to each other.

11. A method as claimed in claim 1 comprising allocating a predetermined number of output stages to be active at a given time by means of each setting value class.

12. A power amplifier comprising:

two output stages connected in series at an output side;

a classification stage for receiving setting values for respectively operating said output stages and for classifying said setting values respectively into setting value classes;

an administration stage, supplied with the classification of said setting values into said setting value classes, for determining an operating mode for each output stage dependent on the setting value class of the setting value for that output stage, and on a time slice value, generated by a time slice counter, which time-dependently allocates the operating modes to the output stages, respectively; and a control signal generator, supplied with the determination of the respective operating modes for the output stages, for generating at least one control signal for each of said output stages dependent on said operating mode and on the setting value for the output stage.

* * * * *